(12) United States Patent
Li et al.

(10) Patent No.: US 11,862,711 B2
(45) Date of Patent: Jan. 2, 2024

(54) METHOD FOR FABRICATING THIN FILM TRANSISTOR SUBSTRATE

(71) Applicant: SHENZHEN CHINA STAR OPTOELECTRONICS SEMICONDUCTOR DISPLAY TECHNOLOGY CO., LTD., Guangdong (CN)

(72) Inventors: Ziran Li, Shenzhen (CN); Qianyi Zhang, Shenzhen (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 213 days.

(21) Appl. No.: 16/618,676

(22) PCT Filed: Oct. 22, 2019

(86) PCT No.: PCT/CN2019/112470
§ 371 (c)(1),
(2) Date: Dec. 2, 2019

(87) PCT Pub. No.: WO2020/232964
PCT Pub. Date: Nov. 26, 2020

(65) Prior Publication Data
US 2023/0163199 A1    May 25, 2023

(30) Foreign Application Priority Data

May 17, 2019  (CN) .......................... 201910413789.6

(51) Int. Cl.
*H01L 21/311*    (2006.01)
*H01L 29/66*    (2006.01)
(Continued)

(52) U.S. Cl.
CPC .. *H01L 29/66742* (2013.01); *H01L 21/31116* (2013.01); *H01L 21/823418* (2013.01); *H01L 29/7869* (2013.01); *H01L 29/78633* (2013.01)

(58) Field of Classification Search
CPC ....... H01L 21/31116; H01L 21/823418; H01L 21/027; H01L 21/336; H01L 29/66742;
(Continued)

(56) References Cited

U.S. PATENT DOCUMENTS 9,533,332 B2 * 1/2017 Sun ...................... C23C 16/4405
9,614,098 B2 * 4/2017 Zhao ................. H01L 21/02565
(Continued)

FOREIGN PATENT DOCUMENTS

CN    101840865 A    9/2010
CN    103531641 A    1/2014
(Continued)

*Primary Examiner* — Nikolay K Yushin
(74) *Attorney, Agent, or Firm* — PV IP PC; Wei Te Chung; Zhigang Ma

(57) ABSTRACT

The present disclosure provides a method for fabricating a thin film transistor substrate, which includes: sequentially depositing a light shielding layer pattern, a buffer layer, an active layer pattern, a gate insulating layer, and a gate layer; wet etching the gate layer to form a gate layer pattern with a photoresist; stripping off the photoresist; forming a protective layer covering the gate layer pattern; etching the gate insulating layer to form a gate insulating layer pattern; and metalizing a non-channel region of the active layer pattern. This method can ensure that an orthographic projection of the gate layer pattern on the substrate completely coincides with that of the gate insulating pattern. Therefore, the entire active layer pattern is regulated by the gate layer pattern, thereby improving a turn-on current of a thin film transistor.

9 Claims, 4 Drawing Sheets

(51) Int. Cl.
*H01L 21/8234* (2006.01)
*H01L 29/786* (2006.01)

(58) Field of Classification Search
CPC ........... H01L 29/78633; H01L 29/7869; H01L 29/786
See application file for complete search history.

(56) References Cited

U.S. PATENT DOCUMENTS

| | | | |
|---|---|---|---|
| 10,468,434 B2* | 11/2019 | Lee | H01L 21/02595 |
| 2012/0267622 A1 | 10/2012 | Yamazaki et al. | |
| 2013/0087174 A1* | 4/2013 | Sun | H01J 37/32449 |
| | | | 134/30 |
| 2016/0013317 A1* | 1/2016 | Zhao | H01L 29/24 |
| | | | 257/43 |
| 2017/0294456 A1* | 10/2017 | Lee | H01L 27/1225 |
| 2018/0182783 A1 | 6/2018 | Ltd | |

FOREIGN PATENT DOCUMENTS

| | | |
|---|---|---|
| CN | 105529366 A | 4/2016 |
| CN | 106158978 A | 11/2016 |
| CN | 109742029 A | 5/2019 |
| CN | 110190031 A | 8/2019 |
| JP | H10335668 A | 12/1998 |

* cited by examiner

METHOD FOR FABRICATING THIN FILM TRANSISTOR SUBSTRATE

FIELD OF INVENTION

The present disclosure relates to a field of display panel technology, and particularly to a method for fabricating a thin film transistor substrate.

BACKGROUND

Thin film transistors with top-gate structure (top-gate TFTs) have low parasitic capacitance and excellent electrical characteristics and, thus, are widely used in display devices.

In the prior art, a top-gate TFT is fabricated by a self-aligning process between a gate pattern and a gate insulating pattern. The gate pattern is usually fabricated by a wet etching process. The gate insulating pattern is fabricated by a dry etching process. When a gate layer is etched by the wet etching process, an etching solution will etch more gate layer under a photoresist so that the gate pattern is smaller than the gate insulating pattern. That is, an orthographic projection of the gate pattern does not completely coincide with that of the gate insulating pattern on a substrate. Because there is no gate on edge of the gate insulating pattern, a portion of an active layer pattern under a portion of the gate insulating pattern that is not covered by the gate is not regulated by the gate, resulting in insufficient turn-on current of the top-gate TFT, thereby affecting electrical characteristics of the top-gate TFT and affecting display effect of a display device.

Therefore, it is necessary to develop a novel method for fabricating a thin film transistor substrate to overcome the drawbacks of the prior art.

SUMMARY OF DISCLOSURE

The present disclosure provides a method for fabricating a thin film transistor substrate to solve the technical problem, in the prior art, of the insufficient turn-on current of the thin film transistor caused by no gate on the edge of the gate insulating layer pattern.

To solve the aforementioned technical problem, the present disclosure provides a method for fabricating a thin film transistor substrate. The method comprises:

Step S1: providing a substrate, depositing a light shielding layer on the substrate, and etching the light shielding layer to form a light shielding layer pattern;

Step S2: sequentially depositing a buffer layer and an active layer, and etching the active layer to form an active layer pattern;

Step S3: sequentially depositing a gate insulating layer and a gate layer on the active layer pattern, and wet etching the gate layer to form a gate layer pattern with a photoresist;

Step S4: stripping off the photoresist, dry etching a surface of the gate layer pattern, and forming a protective layer on the surface of the gate layer pattern; and dry etching the gate insulating layer to form a gate insulating layer pattern and metalizing a non-channel region of the active layer pattern;

Step S5: depositing an interlayer dielectric layer, and forming a first via hole through the interlayer dielectric layer;

Step S6: depositing a source/drain layer and etching the source/drain layer to form a source/drain layer pattern;

Step S7: depositing an organic layer, and forming a second via hole through the organic layer; and Step S8: depositing a pixel electrode layer and etching the pixel electrode layer to form a pixel electrode.

In Step S4, the dry etching the gate insulating layer to form the gate insulating layer pattern and metalizing the non-channel region of the active layer pattern are performed by using the gate layer pattern as a mask. This step can ensure that an orthographic projection of the gate layer pattern completely coincides with that of the gate insulating pattern on the substrate. That is, the entire active layer pattern is under the gate insulating layer pattern. Therefore, the entire active layer pattern can be regulated by the gate layer pattern. This step solves the drawbacks, in the prior art, of no gate on the edge of the gate insulating layer pattern, thereby improving a turn-on current and electrical characteristics of a thin film transistor and improving display effect of a display device.

In an embodiment, the active layer is an oxide semiconductor.

In an embodiment, the oxide semiconductor is indium gallium zinc oxide.

In an embodiment, the active layer has a thickness of 400 Å to 600 Å.

In an embodiment, the gate insulating layer is composed of silicon oxide or silicon nitride.

In an embodiment, in the step S4, the dry etching the surface of the gate layer pattern is performed with a fluorine-based etching gas.

In an embodiment, the fluorine-based etching gas is composed of nitrogen trifluoride and oxygen.

In an embodiment, in the step S4, the metalizing the non-channel region of the active layer pattern is performed by bombarding the non-channel region with argon or helium ions.

In an embodiment, in the step S4, the metalizing the non-channel region of the active layer pattern is performed by implanting aluminum or calcium ions.

In an embodiment, the protective layer has a thickness ranging from 40 Å to 60 Å.

The present disclosure provides a method for fabricating a thin film transistor substrate, comprising: sequentially depositing an active layer, a gate insulating layer, and a gate layer on a substrate, wet etching the gate layer to form a gate layer pattern, forming a protective layer on a surface of the gate layer pattern, and etching the gate insulating layer and metalizing a naked region of the active layer with the gate layer pattern as a mask. This method can ensure that an orthographic projection of the gate layer pattern completely coincides with that of the gate insulating pattern on the substrate. That is, the entire active layer pattern is under the gate insulating layer pattern. Therefore, the entire active layer pattern can be regulated by the gate layer pattern. This method solves the drawbacks, in the prior art, of no gate on the edge of the gate insulating layer pattern, thereby improving a turn-on current and electrical characteristics of a thin film transistor and improving display effect of a display device.

BRIEF DESCRIPTION OF DRAWINGS

In order to more clearly illustrate the technical solutions in the embodiments of the present disclosure or the prior art, a brief description of accompanying drawings used in the description of the embodiments of the present disclosure or the prior art will be given below. The accompanying drawings in the following description are merely some embodiments of the present disclosure. For those skilled in the art, other drawings may be obtained from these accompanying drawings without creative labor.

DETAILED DESCRIPTION

The technical solutions in the embodiments of the present disclosure will be clearly and completely described below in conjunction with the accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within the claimed scope of the present disclosure.

The specific structural and functional details disclosed herein are merely representative and are for the purpose of describing exemplary embodiments of the present disclosure. The present disclosure may be embodied in many alternative ways and should not be construed as being limited only to the embodiments described herein.

Figure 1:
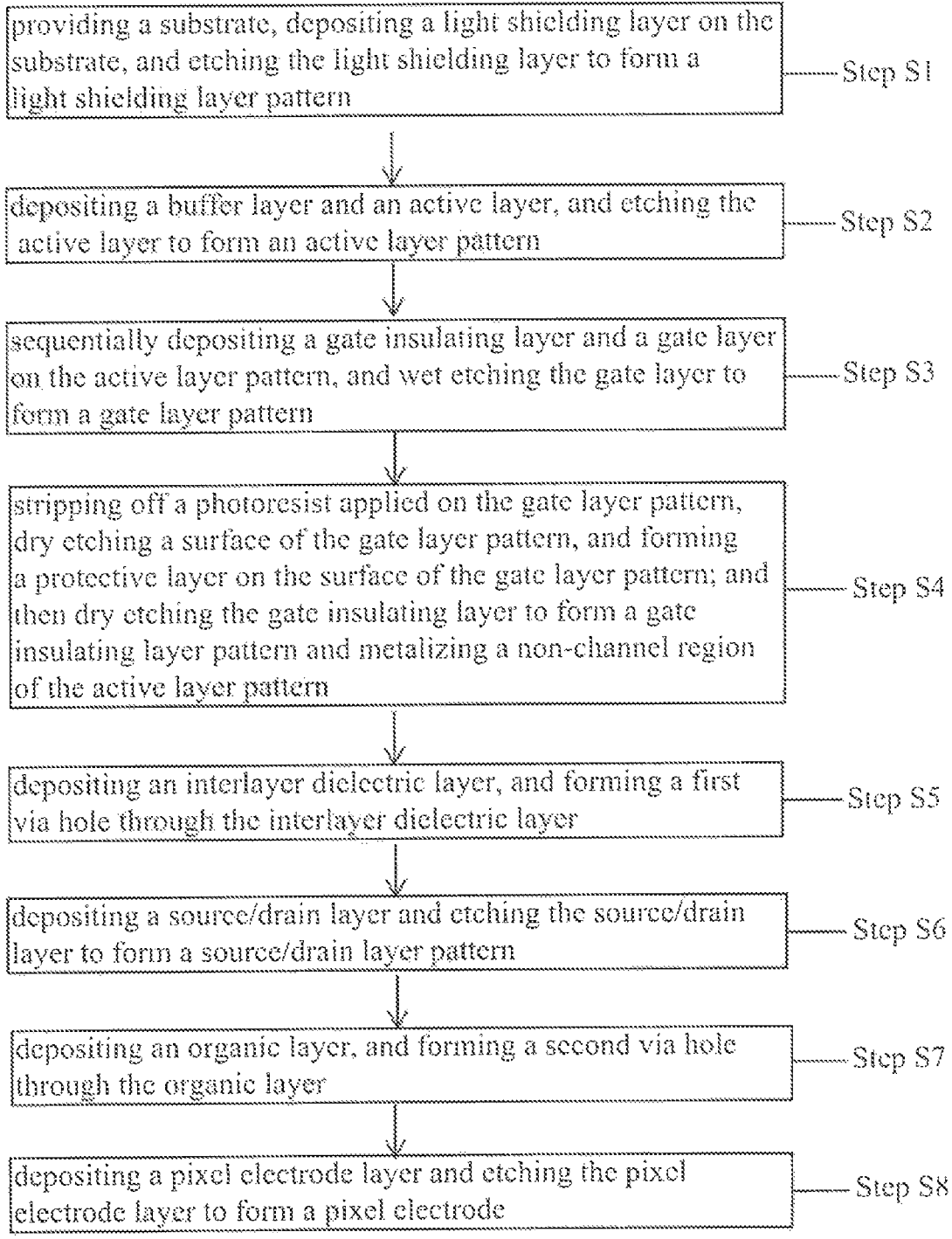
FIG. 1 is a flowchart of a method for fabricating a thin film transistor substrate according to an embodiment of the present disclosure.

The present disclosure provides a method for fabricating a thin film transistor substrate. Please refer to FIG. 1, which is a flowchart of a method for fabricating a thin film transistor substrate according to an embodiment of the present disclosure. The method comprises the following steps.

Step S1: providing a substrate 100, depositing a light shielding layer on the substrate 100, and etching the light shielding layer to form a light shielding layer pattern 11.

Figure 2:
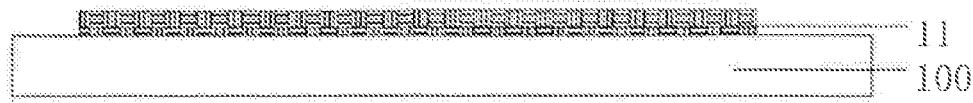
FIG. 2 is a schematic diagram of a thin film transistor substrate in step S1 in the method according to the embodiment of the present disclosure.

Please refer to FIG. 2, which is a schematic diagram of a thin film transistor substrate in step S1 in the method according to the embodiment of the present disclosure.

Step S2: depositing a buffer layer 12 and an active layer, and etching the active layer to form an active layer pattern 13.

Figure 3:
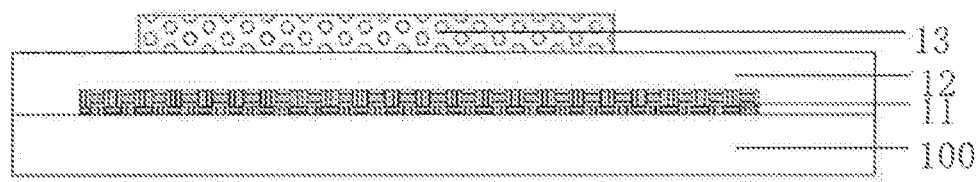
FIG. 3 is a schematic diagram of a thin film transistor substrate in step S2 in the method according to the embodiment of the present disclosure.

Please refer to FIG. 3, which is a schematic diagram of a thin film transistor substrate in step S2 in the method according to the embodiment of the present disclosure.

In this embodiment, the active layer may be composed of indium tin oxide (ITO), indium zinc oxide (IZO) or indium gallium zinc oxide (IGZO), but is not limited thereto.

In this embodiment, the active layer has a thickness of 400 Å to 600 Å.

Step S3: sequentially depositing agate insulating layer 14 and agate layer on the active layer pattern 13, and wet etching the gate layer to form a gate layer pattern 15 with a photoresist.

Figure 4:
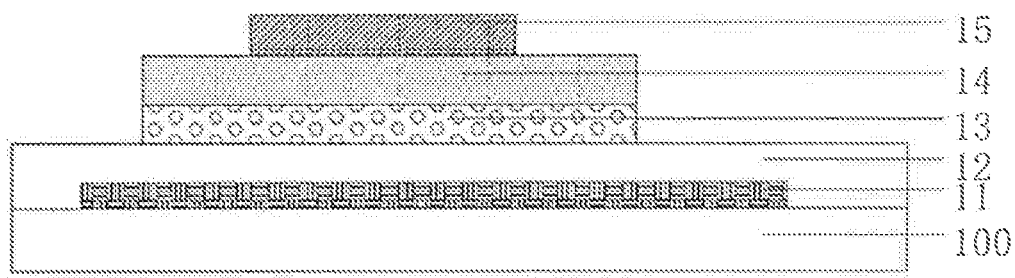
FIG. 4 is a schematic diagram of a thin film transistor substrate in step S3 in the method according to the embodiment of the present disclosure.

Please refer to FIG. 4, which is a schematic diagram of a thin film transistor substrate in step S3 in the method according to the embodiment of the present disclosure.

In this embodiment, the gate insulating layer 14 may be composed of silicon oxide or silicon nitride but is not limited thereto.

Step S4: stripping off the photoresist, dry etching a surface of the gate layer pattern 15, and forming a protective layer 151 on the surface of the gate layer pattern 15; and dry etching the gate insulating layer 14 to form a gate insulating layer pattern 14, and metalizing a non-channel region 131 of the active layer pattern 13.

Figure 5:
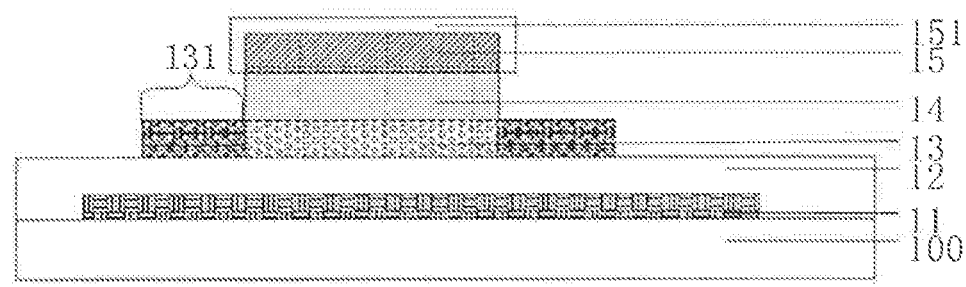
FIG. 5 is a schematic diagram of a thin film transistor substrate in step S4 in the method according to the embodiment of the present disclosure.

Please refer to FIG. 5, which a schematic diagram of a thin film transistor substrate in step S4 in the method according to the embodiment of the present disclosure.

The protective layer 151 is configured to protecting the gate layer pattern 15, and preventing the gate layer pattern 15 from being etched when the gate insulating layer 14 is etched and the active layer pattern 13 is metalized.

In this embodiment, the protective layer 151 has a thickness ranging from 40 Å to 60 Å.

In this embodiment, the dry etching the surface of the gate layer pattern 15 is performed with a fluorine-based etching gas, specifically nitrogen trifluoride and oxygen.

In this embodiment, the metalizing the non-channel region of the active layer pattern 15 may be performed by bombarding the non-channel region with argon or helium ions, or by implanting aluminum or calcium ions, but is not limited thereto.

The dry etching the gate insulating layer 14 to form the gate insulating layer pattern 14 and metalizing the non-channel region 131 of the active layer pattern 13 are performed by using the gate layer pattern 15 as a mask. This step can ensure that width of the gate layer pattern 15 is equal to that of the gate insulating layer pattern 14, and that an orthographic projection of the gate layer pattern 15 completely coincides with that of the gate insulating pattern 14 on the substrate. That is, the entire active layer pattern 13 is under the gate insulating layer pattern 14. Therefore, the entire active layer pattern 13 can be regulated by the gate layer pattern 15. This step solves the drawbacks, in the prior art, of no gate on the edge of the gate insulating layer pattern, thereby improving a turn-on current and electrical characteristics of a thin film transistor and improving display effect of a display device.

Step S5: depositing an interlayer dielectric layer 16, and forming a first via hole 161 through the interlayer dielectric layer 16.

Figure 6:
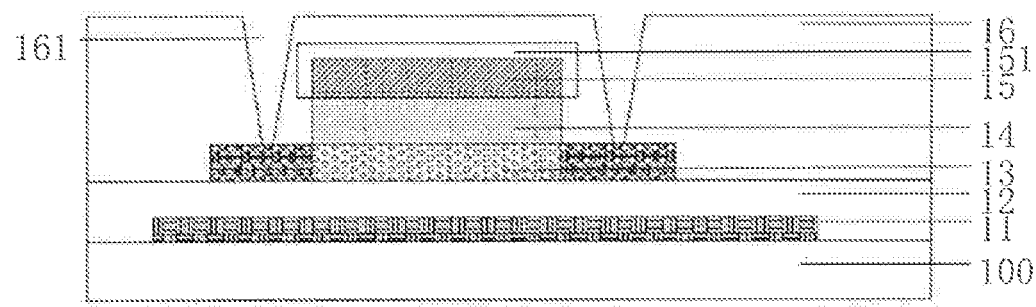
FIG. 6 is a schematic diagram of a thin film transistor substrate in step S5 in the method according to the embodiment of the present disclosure.

Please refer to FIG. 6, which is a schematic diagram of a thin film transistor substrate in step S5 in the method according to the embodiment of the present disclosure.

Step S6: depositing a source/drain layer and etching the source/drain layer to form a source/drain layer pattern 17.

Figure 7:
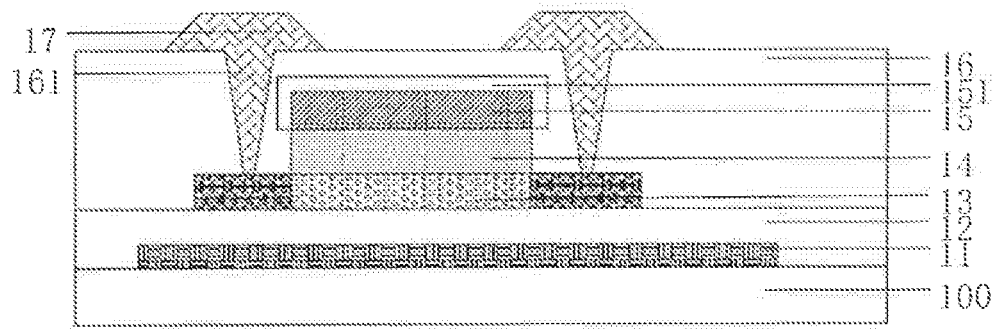
FIG. 7 is a schematic diagram of a thin film transistor substrate in step S6 in the method according to the embodiment of the present disclosure.

Please refer to FIG. 7, which is a schematic diagram of a thin film transistor substrate in step S6 in the method according to the embodiment of the present disclosure Step S7: depositing an organic layer 18, and forming a second via hole 181 through the organic layer 18.

Figure 8:
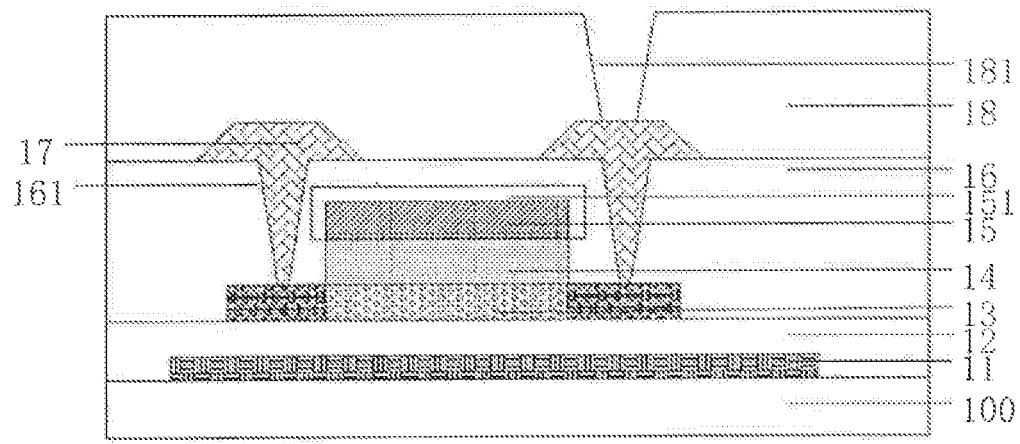
FIG. 8 is a schematic diagram of a thin film transistor substrate in step S7 in the method according to the embodiment of the present disclosure.

Please refer to FIG. 8, which is a schematic diagram of a thin film transistor substrate in step S7 in the method according to the embodiment of the present disclosure.

Step S8: depositing a pixel electrode layer and etching the pixel electrode layer to form a pixel electrode 19.

Figure 9:
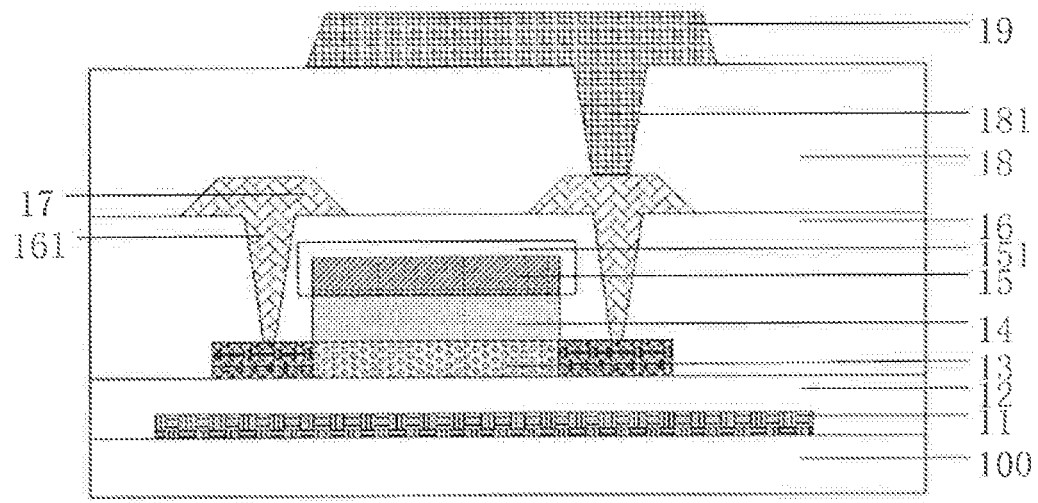
FIG. 9 is a schematic diagram of a thin film transistor substrate in step S8 in the method according to the embodiment of the present disclosure.

Please refer to FIG. 9, which is a schematic diagram of a thin film transistor substrate in step S8 in the method according to the embodiment of the present disclosure.

The present disclosure provides a method for fabricating a thin film transistor substrate, comprising: sequentially depositing an active layer, a gate insulating layer, and a gate layer on a substrate, wet etching the gate layer to form a gate layer pattern, forming a protective layer on a surface of the gate layer pattern, and etching the gate insulating layer and metalizing a naked region of the active layer with the gate layer pattern as a mask. This method can ensure that an orthographic projection of the gate layer pattern completely coincides with that of the gate insulating pattern on the substrate. That is, the entire active layer pattern is under the gate insulating layer pattern. Therefore, the entire active layer pattern can be regulated by the gate layer pattern. This method solves the drawbacks, in the prior art, of no gate on the edge of the gate insulating layer pattern, thereby improving a turn-on current and electrical characteristics of a thin film transistor and improving display effect of a display device.

The above description is only preferred embodiments of the present disclosure. it should be noted that those skilled in the art can make various modifications to the above embodiments without departing from the technical idea of the present disclosure, and the modifications are all within the scope defined by the claims of the present disclosure.

What is claimed is:

1. A method for fabricating a thin film transistor substrate, comprising:
   Step S1: providing a substrate, depositing a light shielding layer on the substrate, and etching the light shielding layer to form a light shielding layer pattern;
   Step S2: sequentially depositing a buffer layer and an active layer, and etching the active layer to form an active layer pattern;
   Step S3: sequentially depositing a gate insulating layer and a gate layer on the active layer pattern, and wet etching the gate layer to form a gate layer pattern with a photoresist;
   Step S4: stripping off the photoresist, and after the photoresist is removed, dry etching a surface of the gate layer pattern by using a fluorine-based etching gas and forming a protective layer on the surface of the gate layer pattern; and dry etching the gate insulating layer to form a gate insulating layer pattern and making conductive a non-channel region of the active layer pattern, wherein an orthographic projection of the gate layer pattern projected on the substrate completely coincides with an orthographic projection of the gate insulating pattern projected on the substrate, and the entire active layer pattern is under the gate insulating layer pattern;
   Step S5: depositing an interlayer dielectric layer, and forming a first via hole through the interlayer dielectric layer;
   Step S6: depositing a source/drain layer and etching the source/drain layer to form a source/drain layer pattern;
   Step S7: depositing an organic layer, and forming a second via hole through the organic layer; and
   Step S8: depositing a pixel electrode layer and etching the pixel electrode layer to form a pixel electrode.

2. The method according to claim 1, wherein the fluorine-based etching gas is composed of nitrogen trifluoride and oxygen.

3. The method according to claim 1, wherein in the step S4, the metalizing the non-channel region of the active layer pattern is performed by bombarding the non-channel region with argon or helium ions.

4. The method according to claim 1, wherein in the step S4, the metalizing the non-channel region of the active layer pattern is performed by implanting aluminum or calcium ions.

5. The method according to claim 1, wherein the active layer is an oxide semiconductor.

6. The method according to claim 5, wherein the oxide semiconductor is indium gallium zinc oxide.

7. The method according to claim 1, wherein the active layer has a thickness of 400 Å to 600 Å.

8. The method according to claim 1, wherein the protective layer has a thickness ranging from 40 Å to 60 Å.

9. The method according to claim 1, wherein the gate insulating layer is composed of silicon oxide or silicon nitride.

* * * * *